United States Patent
Su et al.

(10) Patent No.: US 11,380,796 B2
(45) Date of Patent: Jul. 5, 2022

(54) TOP GATE THIN FILM TRANSISTOR, FABRICATING METHOD THEREOF, ARRAY SUBSTRATE AND DISPLAY APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Tongshang Su, Beijing (CN); Dongfang Wang, Beijing (CN); Jun Liu, Beijing (CN); Guangyao Li, Beijing (CN); Wei Li, Beijing (CN); Qinghe Wang, Beijing (CN); Chao Wang, Beijing (CN); Tao Sun, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/638,283

(22) PCT Filed: Aug. 7, 2019

(86) PCT No.: PCT/CN2019/099659
§ 371 (c)(1),
(2) Date: Feb. 11, 2020

(87) PCT Pub. No.: WO2020/134098
PCT Pub. Date: Jul. 2, 2020

(65) Prior Publication Data
US 2020/0251596 A1    Aug. 6, 2020

(30) Foreign Application Priority Data
Dec. 24, 2018    (CN) .......................... 201811583504.5

(51) Int. Cl.
*H01L 29/786* (2006.01)
*H01L 27/12* (2006.01)
(Continued)

(52) U.S. Cl.
CPC ...... *H01L 29/78618* (2013.01); *H01L 27/127* (2013.01); *H01L 27/1222* (2013.01);
(Continued)

(58) Field of Classification Search
CPC .......... H01L 29/78618; H01L 27/1222; H01L 27/127; H01L 29/41733; H01L 29/66757;
(Continued)

(56) References Cited

U.S. PATENT DOCUMENTS

2007/0054442 A1    3/2007  Liu et al.
2016/0181437 A1*   6/2016  Bu ................... H01L 21/02532
                                                                257/66
(Continued)

FOREIGN PATENT DOCUMENTS

CN    103500756 A    1/2014
CN    105552084 A    5/2016
(Continued)

OTHER PUBLICATIONS

International Search Report dated Nov. 18, 2019, issued in counterpart CN Application No. PCT/CN2019/099659 (4 pages).
(Continued)

*Primary Examiner* — Mohammed R Alam
(74) *Attorney, Agent, or Firm* — WHDA, LLP

(57) ABSTRACT

The disclosure relates to a thin film transistor. The thin film transistor may include a substrate, an active layer on the substrate, a gate on the active layer, and a source and a drain. The active layer may include a first conducting region, a second conducting region, and a channel region between the first conducting region and the second conducting region.
(Continued)

An orthographic projection of the source and an orthographic projection of the drain on the substrate may cover at least an orthographic projection of a first conducting region and an orthographic projection of a second conducting region on the substrate.

16 Claims, 5 Drawing Sheets

(51) Int. Cl.
  *H01L 29/417* (2006.01)
  *H01L 29/66* (2006.01)
  *H01L 27/32* (2006.01)
(52) U.S. Cl.
  CPC .. *H01L 29/41733* (2013.01); *H01L 29/66757* (2013.01); *H01L 29/78633* (2013.01); *H01L 29/78675* (2013.01); *H01L 27/3262* (2013.01); *H01L 27/3272* (2013.01)
(58) Field of Classification Search
  CPC ......... H01L 29/78633; H01L 29/78675; H01L 27/3262; H01L 27/3272; H01L 27/1214; H01L 29/66742; H01L 29/786
  See application file for complete search history.

(56) References Cited

U.S. PATENT DOCUMENTS

| | | | |
|---|---|---|---|
| 2018/0033808 A1* | 2/2018 | Li | ................. H01L 29/42384 |
| 2019/0079331 A1* | 3/2019 | Miyamoto | .......... H01L 27/1248 |
| 2019/0131457 A1 | 5/2019 | Wang et al. | |
| 2019/0229017 A1* | 7/2019 | Liu | .................... H01L 27/3258 |
| 2019/0267493 A1 | 8/2019 | Wang et al. | |

FOREIGN PATENT DOCUMENTS

| | | |
|---|---|---|
| CN | 107068770 A | 8/2017 |
| CN | 107482055 A | 12/2017 |
| CN | 107910375 A | 4/2018 |
| CN | 109075204 A | 12/2018 |
| CN | 109686793 A | 4/2019 |

OTHER PUBLICATIONS

Office Action dated Mar. 31, 2020, issued in counterpart CN Application No. 201811583504.5, with English translation (22 pages).

* cited by examiner

TOP GATE THIN FILM TRANSISTOR, FABRICATING METHOD THEREOF, ARRAY SUBSTRATE AND DISPLAY APPARATUS

CROSS-REFERENCE TO RELATED APPLICATIONS

This application claims benefit of the filing date of Chinese Patent Application No. 201811583504.5 filed on Dec. 24, 2018, the disclosure of which is hereby incorporated in its entirety by reference.

TECHNICAL FIELD

The present disclosure relates to display technologies, and in particular, to a thin film transistor, a method for fabricating the same, an army substrate, and a display apparatus.

BACKGROUND

A top gate thin film transistor is a thin film transistor whose gate is fabricated above an active layer. The top gate thin film transistor has been widely used because of the advantages such as relatively simple fabrication process requiring fewer lithography processes and small parasitic capacitance between source drain and gate.

BRIEF SUMMARY

One embodiment of the present disclosure provides a thin film transistor. The thin film transistor may include a substrate, an active layer on the substrate, a gate on the active layer, and a source and a drain. The active layer may include a first conducting region, a second conducting region, and a channel region between the first conducting region and the second conducting region. An orthographic projection of the source and an orthographic projection of the drain on the substrate may cover at least an orthographic projection of a first conducting region and an orthographic projection of a second conducting region on the substrate.

Optionally, the orthographic projection of the source and the orthographic projection of the drain on the substrate each further cover an orthographic projection of a part of the channel region that is not covered by the gate on the substrate.

Optionally, the orthographic projection of the source and the orthographic projection of the drain on the substrate each have an overlapping area, with an orthographic projection of the gate on the substrate.

Optionally, the overlapping area has a side length of less than about 0.5 μm.

Optionally, an increased parasitic capacitance caused by that the source and the drain shielding the active layer is less than 50 fF/μm.

Optionally, the thin film transistor further comprises a gate insulating layer between the active layer and the gate, and an interlayer insulating layer covering the active layer, the gate insulating layer, and the gate. The source and the drain are connected to the active layer through a first via hole and a second via hole penetrating through the interlayer insulating layer, respectively.

Optionally, the thin film transistor further comprises a light shielding layer between the substrate and the active layer; and a buffer layer between the light shielding layer and the active layer. The light shielding layer is configured to prevent light from irradiating the active layer from a bottom of the thin film transistor.

Optionally, the thin film transistor is a top gate thin film transistor.

One embodiment of the present disclosure provides a method for fabricating a thin film transistor. The method may include providing a substrate; forming an active layer comprising a first conducting region, a second conducting region, and a channel region between the first conducing region and the second conducting region; forming a gate on the active layer; forming an interlayer insulating layer covering the active layer and the gate: and forming a source and a drain on a side of the interlayer insulating layer opposite from the substrate. An orthographic projection of the source and an orthographic projection of the drain on the substrate cover at least an orthographic projection of the first conducting region and an orthographic projection of the second conducting region on the substrate.

Optionally, forming the source and the drain comprises depositing a metal layer on the side of the interlayer insulating layer opposite from the substrate, patterning the metal layer using a mask to form the source and the drain. An orthographic projection of the mask on the substrate covers at least the orthographic projection of the first conducting region and the orthographic projection of the second conducting region on the substrate.

Optionally, the orthographic projection of the mask on the substrate further covers an orthographic projection of as part of the channel region that is not covered by the gate on the substrate.

Optionally, the orthographic projection of the mask on the substrate further has an overlapping area with an orthographic projection of the gate on the substrate from both sides of the gate, and a side length of the overlapping, area on each side is less than about 0.5 μm.

Optionally, the method further comprises forming a first via hole and a second via hole in the interlayer insulating, layer. The source is connected to the first conducting region through the first via hole, and the drain is connected to the second conducting region through the second via hole.

Optionally, the method, before forming the active layer, further comprises forming a light shielding layer on the substrate; and forming a buffer layer on a side of the light shielding layer opposite from the substrate. The light shielding layer is configured to prevent light from irradiating the active layer from a bottom of the thin film transistor.

One embodiment of the present disclosure provides an array substrate, comprising the thin film transistor according to one embodiment of the present disclosure.

One embodiment of the present disclosure provides a display apparatus, comprising the array substrate according to one embodiment of the present disclosure.

BRIEF DESCRIPTION OF THE DRAWINGS

The drawings are intended to provide a further understanding of the technical solutions of the present disclosure, and are intended to be a part of the specification, and are used to explain the technical solutions of the present disclosure, and do not constitute a limitation of the technical solutions of the present disclosure.

The above and/or additional aspects and advantages of the present disclosure will become apparent and readily understood from the description of the embodiments of the accompanying drawings.

DETAILED DESCRIPTION

Figure 1:
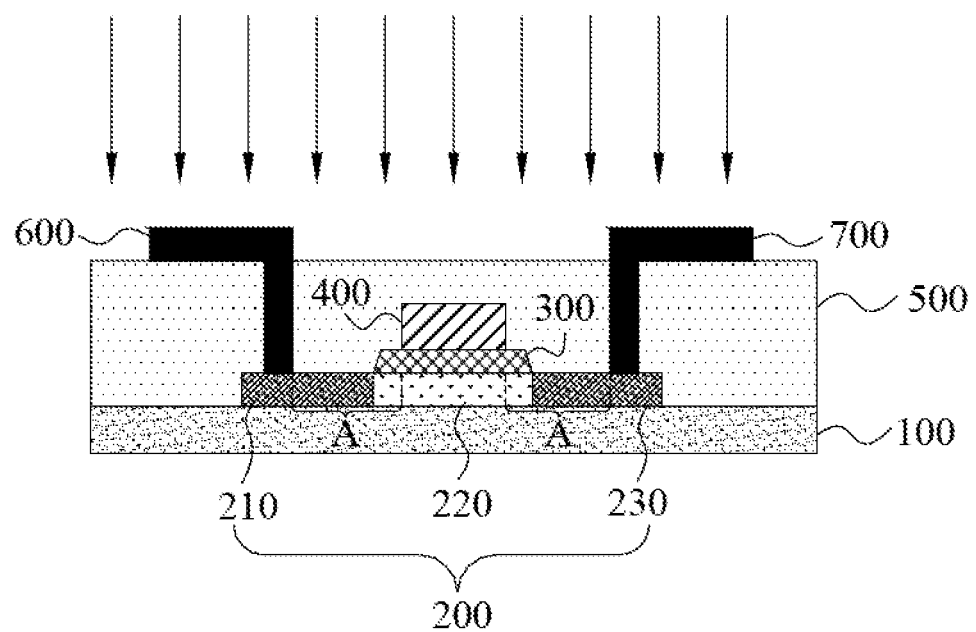
FIG. 1 illustrates a schematic diagram of a conventional thin film transistors in the related art.

The embodiments of the present disclosure are described in detail below, and the examples of the embodiments are illustrated in the drawings, wherein the same or similar reference numerals are used to refer to the same or similar elements or elements having the same or similar functions. The following embodiments described with reference to the accompanying drawings are exemplary for explaining the present disclosure and are not to be construed as limiting the present disclosure.

In the disclosure, unless explicitly stated and defined otherwise, when the first feature is "above" or on the second feature or "below" or under the second feature, the two features can be in direct contact or indirect contact through an intermediate medium. A numerical value modified by "about" herein means that numerical value can vary by 10% thereof.

There is a low light stability problem for an active layer of a top gate thin film transistor in the related art. Specifically, FIG. 1 illustrates a schematic &a gain of a conventional thin film transistor in the related art. As shown in FIG. 1, the source 500 is connected to the active layer 200 through the first via hole in the interlayer insulating layer 500 and the drain 700 is connected to the active layer 200 through the second via hole in the interlayer insulating layer 500. The source 600 and the drain 700, disposed on one side of the interlayer insulating, layer 500 opposite from the substrate 100, respectively cover the first via hole and the second via hole to ensure good electrical connections in the first via hole and the second via hole, thereby achieving electrical connections with the active layer 200. When the top gate thin film transistor is exposed to the top light as indicated by the arrows in FIG. 1, light diffuses onto the active layer 200 through the gaps between the source 600 and the gate 400, and between the drain 700 and the gate 400. For example, the light may diffuse and irradiate region A of the active layer 200 as illustrated in FIG. 1. The region A in the active layer 200 will accordingly produce a large number of electron/hole pairs after being irradiated, thereby resulting in a large negative drift of the threshold voltage, and causing the problem of lower light stability of the top gate film transistor. As a result, the display effect of the display apparatus using the top gate thin film transistor is decreased.

Figure 2:
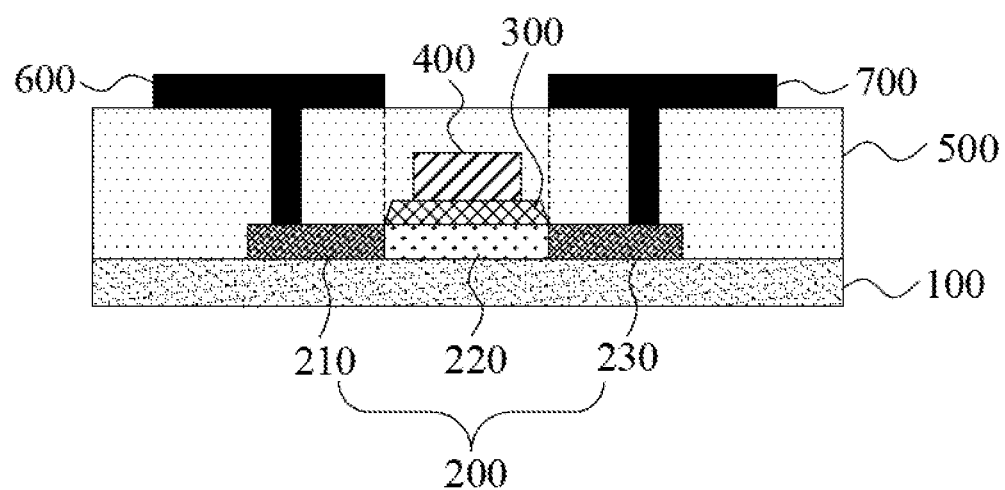
FIG. 2. illustrates a schematic diagram of a thin film transistor according to one embodiment of the present disclosure.

One embodiment of the present disclosure provides a thin film transistor. Referring to FIG. 2, the thin film transistor includes a substrate 100, an active layer 200, a gate insulating layer 300, a gate 400, an interlayer insulating layer 500, a source 600, and a drain 700. The substrate 100, the active layer 200, the gate insulating layer 300 and the gate 400 are sequentially stacked. The interlayer insulating layer 500 is disposed on the substrate 100, covering the active layer 200, the gate insulating layer 300 and the gate 400. The interlayer insulating layer 500 is provided with two via holes, which are respectively a first via hole and a second via hole. The source 600 is disposed on a side of the interlayer insulating layer 500 opposite from the substrate 100, and connected to the active layer 200 through the first via hole penetrating the interlayer insulating layer 500. The drain 700 is disposed on a side of the interlayer insulating layer 500 opposite from the substrate 100, and connected to the active layer 200 through the second via hole penetrating the interlayer insulating layer 500. The active layer 200 between the source 600 and the drain 700 includes a first conducting region 210, a second conducting region 230, and a channel region 220. The channel region 220 is disposed between the first conducting region 210 and the second conducting region 230. The first conducting region 210 is adjacent to the source 600 and the second conducting region 230 is adjacent to the drain 700. The source 600 is connected to the first conducting region 210 of the active layer 200 and the drain 700 is connected to the second conducting region 230 of the active layer 200. The orthographic projection of the source 600 and the drain 700 on the substrate 100 covers at least the orthographic projection of the first, conducting region 210 and the second conducting region 230 on the substrate 100. As such, the problem of a large negative drift of the threshold voltage of the top gate thin film transistor being exposed to the top light is alleviated, thereby enhancing the light stability of the top gate thin film transistor and improving the display effect of the display apparatus using the top gate thin film transistor.

The "top light" refers to the light illuminating from the side of the interlayer insulating layer 500 opposite from the substrate 100. In some embodiments of the present disclosure, the source 600 and the drain 700 can block the top light from irradiating the active layer 200, thereby alleviating the problem of the large negative drift of the threshold voltage, enhancing the light stability of the top gate thin film transistor, and improving the display effect of the display apparatus using the top gate thin film transistor.

For ease of understanding, a thin film transistor according to one embodiment of the present disclosure is briefly described below:

In one embodiment of the present disclosure, by modifying the source and the drain located on a side of the interlayer insulating layer opposite from the substrate, the orthographic projection of the source and the drain on the substrate can cover at least the first conducting region and the second conducting region of the active layer, thereby blocking the irradiation of the top light onto the first conducting region and the second conducting region of the active layer and preventing a large amount of electron/hole pairs from being generated in the first conducting region and the second conducting region. As a result, the large negative drift problem of the threshold voltage is alleviated, and the light stability of the top gate thin film transistor is improved.

Optionally, the active layer is composed of polysilicon. The first conducting region and the second conducting region are metalized regions formed by a conducting treatment on the polysilicon on both sides of the channel region in the active layer, thereby achieving electrical connection between the first conducting region and the source and electrical connection between the second conducting region and the drain.

The thin film transistor will be described in detail below according to some embodiments of the present disclosure.

In one embodiment, with reference to FIG. 2, the orthographic projection of the source 600 and the drain 700 on the substrate 100 completely covers the orthographic projection of the first conducting region 210 and the second conducting region 230 on the substrate 100. Therefore, when the top gate thin film transistor is exposed to the top light, the source and the drain can block the irradiation of the top light onto the first conducting region and the second conducting region, thereby alleviating the large negative drift of the threshold voltage and thus improving the light stability of the top gate thin film transistor.

Figure 3:
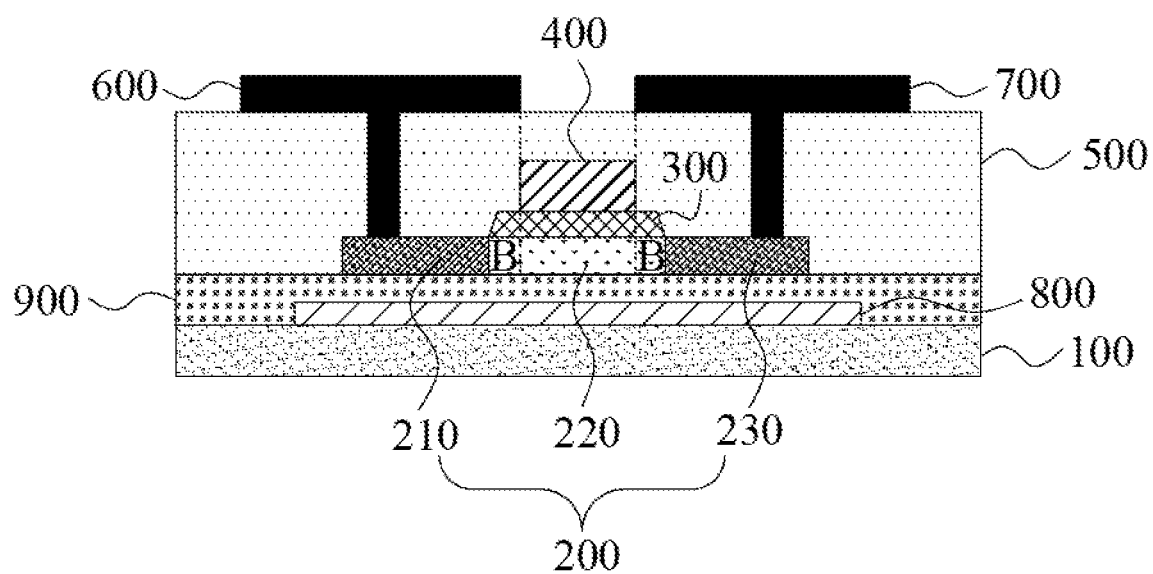
FIG. 3 illustrates a schematic diagram of a thin film transistor according to one embodiment of the present disclosure.

In one embodiment, referring to FIG. 3, the orthographic projection of the source 600 and the drain 700 on the substrate 100 each may also cover the orthographic projection of a part of the channel region 220 not covered by the gate 400 on the substrate 100, that is, region B as shown in FIG. 3. Therefore, when the top-gate thin film transistor is exposed to the top light, the source and the drain in conjunction with the gate can block the irradiation of the top light onto the first conducting region, the second conducting region and the channel region. That is, the source and the drain in conjunction with the gate can block the irradiation of the top light onto the active layer, thereby further alleviating the problem of the large negative drift of the threshold voltage, and further enhancing the light stability of the top gate thin film transistor.

Figure 4:
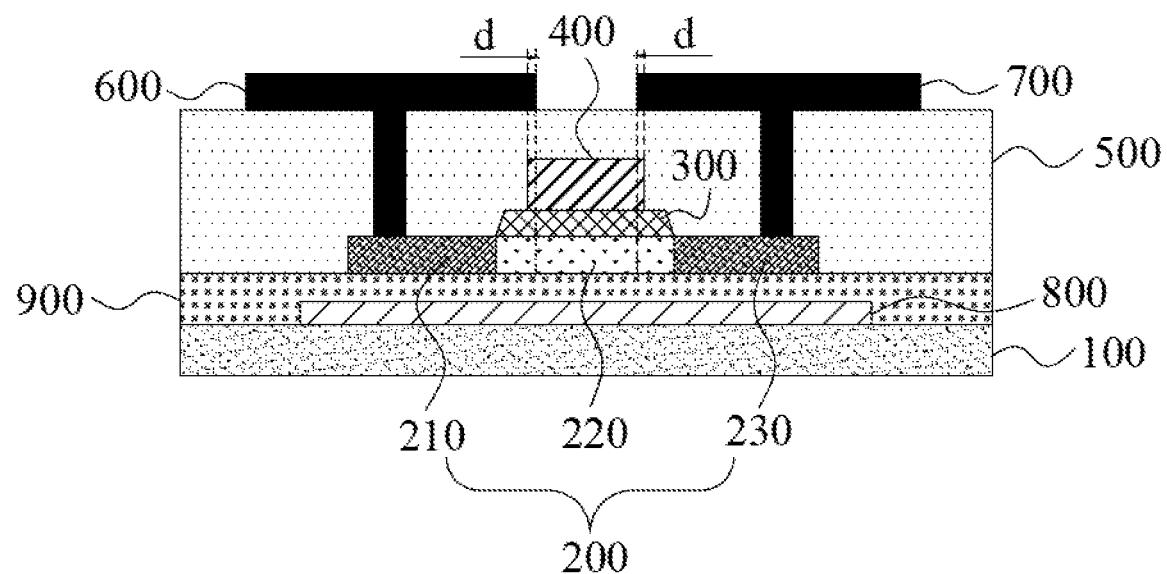
FIG. 4 illustrates a schematic diagram of a thin film transistor according to one embodiment of the present disclosure.

Due to process imprecision in the fabrication process, the orthographic projection of the source and the drain on the substrate does not completely connect to the orthographic projection of the gate on the substrate. That is, due to the issues of the process imprecision, there may be small gaps between the fabricated source and gate, and between the fabricated drain and gate. Therefore, the top light can still irradiate the active layer through the gaps. In one embodiment, in order to avoid the problem above and, minimize the large negative drift of the threshold voltage, the orthographic projection of the source and the drain on the substrate may respectively overlap at least a portion of the orthographic projection of the gate on the substrate. Optionally, referring to FIG. 4, an orthographic projection of the source 600 on the substrate 100 and an orthographic projection of the drain 700 on the substrate 100 each have at least a partial overlapping area with an orthographic projection of the gate 400 on the substrate 100. A side length, d, of the overlapping area between the orthographic projection of the source 600 and the orthographic projection of the gate 400 on the substrate, and a side length, d, of the overlapping area between the orthographic projection of the drain 700 and the orthographic projection of the gate 400 on the substrate may be respectively less than about 0.5 μm, as indicated in FIG. 4. Therefore, when the top-gate thin film transistor is exposed to the top light, the source and the drain in conjunction with the gate can completely block the irradiation of the top light onto the active layer, thereby enhancing the light stability of the top gate thin film transistor.

In one embodiment, the increased parasitic capacitance between the source 600/drain 700 and the gate 400 due to the source 600 and the drain 700 shielding the active layer 200 may be less than about 50 fF/μm preferably within a range of about 10 fF/μm to about 50 fF/μm. Therefore, the increased parasitic capacitance caused by the source and the drain is small. That is, the source and the drain do not significantly increase the parasitic capacitance between the source/drain and the gate. Accordingly, they do not affect the signal transmission performance of the top gate thin film transistor.

According to some embodiments of the present disclosure, when the increased parasitic capacitance caused by the source 600 and the drain 700 shielding the active layer 200 meets the above range, the increased parasitic capacitance is small, thereby not affecting the signal transmission performance of the thin film transistor. That is, in the situation that the orthographic projection of the source and the orthographic projection of the drain on the substrate respectively covers the orthographic projection of the first conducting region and the orthographic, projection of the second conducting region on the substrate, or the orthographic projection of the source and the orthographic projection of the drain on the substrate covers the orthographic projection of a part of the channel region that is not covered by the gate on the substrate, or the orthographic projection of the source and the orthographic projection of the drain on the substrate respectively overlaps with the orthographic projection of the gate on the substrate, when the increased parasitic capacitance between the source/drain and the gate meets the above range, the parasitic capacitance between the source/drain and the gate is not significantly increased. Therefore, the thin film transistor has good light stability and good signal transmission performance.

In one embodiment, it can be understood by those skilled in the art that when the top-gate thin film transistor is applied to an organic light-emitting display apparatus, the top light may be light emitted from the light-emitting layer on the substrate. In the thin film transistor according to one embodiment of the present disclosure, the light emitted from the light-emitting layer may be blocked from irradiating the active layer, thereby enhancing the light stability of the thin film transistor and thus improving the display effect of the display apparatus.

In some embodiments, referring to FIG. 3 and FIG. 4, the thin film transistor may further include a light shielding layer 800 and a buffer layer 900. The light shielding layer 800 is disposed between the substrate 100 and the active layer 200 and the buffer layer 900 is disposed between the light shielding layer 800 and the active layer 200. Therefore, the irradiation of the active layer by the light from the bottom of the top gate thin film transistor can be prevented, and the light stability of the top gate thin film transistor can be improved. The buffer layer is used for planarization and insulation of the light shielding layer, thereby creating good conditions for subsequent deposition of the active layer.

One embodiment of the present disclosure further provides a method of fabricating a thin film transistor. In some embodiments, the thin film transistor fabricated by the method may be the thin film transistor described above according to one embodiment of the present disclosure. The thin film transistor fabricated by the method may have the same features and advantages as the thin film transistor described above, and is not repeated herein.

Figure 5:
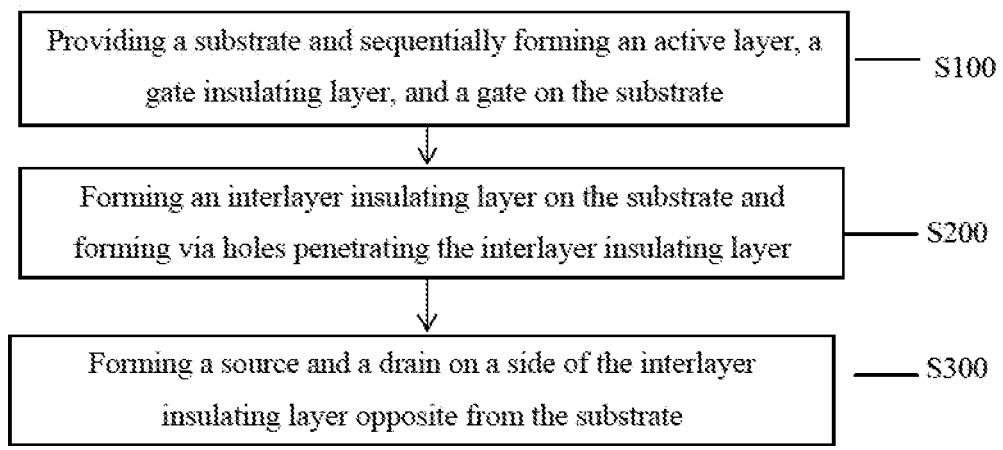
FIG. 5 is a flow chart showing a method of fabricating a thin film transistor according to one embodiment of the present disclosure.

According to one embodiment of the present disclosure, referring to FIG. 5, the method includes steps S100 to S300:

Step S100 includes providing a substrate and sequentially forming an active layer, a gate insulating layer, and a gate on the substrate.

In one embodiment, in this step, a substrate is provided, and an active layer, a gate insulating layer, and a gate are sequentially formed on the substrate. In another embodiment, before forming the active layer on the substrate, the method may further include forming a light shielding layer on the substrate and forming a buffer layer on a side of the light shielding layer opposite from the substrate, thereby preventing light from irradiating the active layer from the bottom of the top gate thin film transistor, and improving the light stability of the top gate thin film transistor.

According to one embodiment of the present disclosure, a process of sequentially forming a light shielding layer, a buffer layer, an active layer, a gate insulating layer, and a gate on a substrate may be as follows.

First, a light shielding material is deposited on the substrate, and a light shielding layer is formed by performing a patterning process on the light shielding material. Subsequently, a buffer layer is deposited on a side of the light shielding layer opposite from the substrate. Subsequently, a material for forming an active layer is deposited on a side of the buffer layer away from the light shielding layer, and an active layer is formed by performing a patterning process on the material for forming the active layer. An orthographic projection of the active layer on the substrate lies within an orthographic projection of the light shielding layer on the substrate. Subsequently, an insulating material is deposited on a side of the active layer away from the buffer layer, and a gate insulating layer is formed by performing a patterning process on the insulating material. An orthographic projection of the gate insulating layer on the substrate lies within the orthographic projection of the active layer on the substrate. Subsequently, a metal layer is deposited on a side of the gate insulating layer away from the active layer, and a gate is formed by performing a patterning process on the metal layer. Finally, by using the gate insulating layer and the gate as a mask, the region of the active layer that is not blocked by the gate insulating layer is subjected to a conducting treatment to form a first conducting region and a second conducting region. The active layer that is not subjected to the treatment between the first conducting region and the second conducting region is a channel region.

Step S200 includes forming an interlayer insulating layer on the substrate and Brining via holes penetrating the interlayer insulating layer.

In one embodiment, in this step, an interlayer insulating layer is formed on the substrate, and via holes penetrating the interlayer insulating layer are formed in the interlayer insulating layer. The via holes include a first via hole and a second via hole. In one embodiment, an interlayer insulating layer is deposited on the substrate, that is, the interlayer insulating layer is deposited on a side of the buffer layer opposite from the substrate and the interlayer insulating layer covers the active layer, the gate insulating layer, and the gate. The first via hole and the second via hole are formed in the interlayer insulating layer by a patterning process, so that the source and the drain fabricated in the subsequent step are connected to the active layer through the first via hole and the second via hole, respectively.

In one embodiment, the first via hole exposes a portion of the first conducting region of the active layer, and the second via hole exposes a portion of the second conducting region of the active layer. That is, the first conducting region of the active layer is adjacent to the first via hole, and the second conducting region of the active layer is adjacent to the second via hole, so that the source fabricated in the subsequent step is connected to the first conducting region through the first via hole and the chain fabricated in the subsequent step is connected to the second conducting region through the second via hole, thereby achieving the function of the thin film transistor.

Step S300 includes forming a source and a drain on a side of the interlayer insulating layer opposite from the substrate to allow the orthographic projection of the source and the orthographic projection of the drain on the substrate to cover at least the orthographic projection of the first conducting region and the orthographic projection of the second conducting region on the substrate, respectively.

In one embodiment, in this step, a source and a drain are formed on a side of the interlayer insulating layer away from the substrate to allow the orthographic, projection of the source and the orthographic projection of the drain on the substrate to cover at least the orthographic projection of the first conducting region and the orthographic projection of the second conducting region on the substrate. In one embodiment, the source is connected to the first conducting region of the active layer through the first via hole in the interlayer insulating layer, and the drain is connected to the second conducting region of the active layer through the second via hole in the interlayer insulating layer. In one embodiment, the source and drain can be formed by the following steps:

First, a metal layer is deposited on a side of the interlayer insulating layer away from the substrate. Subsequently, a source and a drain are formed by performing a patterning process on the metal layer. The mask used in the patterning process for forming the source and the drain covers at least the orthographic projection of the first conducting region and the second conducting region on the substrate. Thus, by modifying the mask used for forming the source and the drain, the method can alleviate the problem of the large negative drift of the threshold voltage. Furthermore, the method does not increase fabrication processes and it is easy to operate.

In one embodiment, an orthographic projection of a mask for forming a source and a drain on the substrate completely covers the orthographic projection of the first conducting region and the second conducting region on the substrate. Thereby, the formed source and the drain can block the top light from irradiating the first conducting region and the second conducting region, thereby alleviating the problem of the large negative drift of the threshold voltage and thus enhancing the illumination stability of the top gate thin film transistor.

In one embodiment, an orthographic projection of the mask for forming the source and the drain on the substrate further covers the orthographic projection of a part of the channel region that is not covered by the gate on the substrate. Thereby, the formed source and the drain can block the top light from irradiating the first conducting region, the second conducting region, and a portion of the channel region that is not covered by the gate. That is, the source and the drain in conjunction with the gate CM block the top light from irradiating the active layer, thereby significantly alleviating the problem of the large negative drift of the threshold voltage and further enhancing the light stability of the top gate thin film transistor.

In one embodiment, in order to avoid small gaps between the source and the gate and between the drain and the gate due to the process imprecision, the mask for forming the source and the drain overlaps at least a portion of the orthographic projection of the gate. A side length of the overlapping area may be less than 0.5 $\mu$m. Thereby, the formed source and the drain in conjunction with the gate may block the top light from irradiating the active layer, thereby significantly improving the light stability of the top gate thin film transistor.

In one embodiment, the increased parasitic capacitance due to the formed source and drain that block the top light exposure to the active layer may be less than about 50 fF/$\mu$m. Since the increased parasitic capacitance is small, the parasitic capacitance does not affect the signal transmission performance of the thin film transistor. That is, in the situation that the orthographic projection of the source, and the drain on the substrate respectively covers the orthographic, projection of the first conducting region and the second conducting region on the substrate, or the orthographic projection of the source and the drain on the substrate further covers the orthographic projection of the channel region that is not covered by the gate on the substrate, or the orthographic projection of the source and the drain on the substrate further overlaps with the orthographic projection of the gate on the substrate, when the increased parasitic capacitance between the source/drain and the gate meets the above range, the parasitic capacitance between the source/drain and the gate is not significantly increased. Therefore, the resulting thin film transistor has good light transmission performance and good sig al transmission performance.

According to some embodiments of the present disclosure, a top gate thin film transistor with high light stability can be obtained by a simple method, thus improving the display effect of the display apparatus. The top-gate thin film transistor does not significantly increase the parasitic capacitance between the source/drain and the gate and accordingly it does not affect the signal transmission performance.

One embodiment of the present disclosure further provides an array substrate including the thin film transistor described above. Thus, the array substrate possesses all the features and advantages of the thin film transistor described above, and details are not repeated herein. In general, the thin film transistor on the array substrate has high light stability and the array substrate has good performance.

Another embodiment of the present disclosure further provides a display apparatus. In one embodiment, the display apparatus comprises the array substrate described above, wherein the display apparatus possesses all the features and advantages of the array substrate described above, and details are not repeated herein. In general, the display apparatus has a good display effect.

The present disclosure is illustrated by the following examples, and the following examples are intended to illustrate the disclosure and are not to be construed as limiting the scope of the disclosure. Where specific techniques or conditions are not indicated in the examples, they are carried out according to the techniques or conditions described in the literature in the art or in accordance with the product specifications.

According to one embodiment of the present disclosure, a thin film transistor includes a substrate, a light shielding layer, a buffer layer, an active layer, a gate insulating layer and a gate, which are sequentially stacked. The interlayer insulating layer is disposed on a side of the buffer layer away from the substrate, covering the active layer, the gate insulating layer, and the gate. The interlayer insulating layer is provided with a first via hole and a second via hole. The active layer between the first via hole and the second via hole includes a first conducting region, a second conducting region, and a channel region disposed between the first conducting region and the second conducting region. The source and the drain are disposed on a side of the interlayer insulating layer away from the substrate. The source is connected to the first conducting region through the first via hole, and the drain is connected to the second conducting region through the second via hole. The orthographic projection of the source and the orthographic projection of the drain on the substrate each have an overlapping area with the orthographic projection of the gate on the substrate, respectively, and a length of a side of the overlapping area may be about 0.2 μm.

In one embodiment, the orthographic projection of the source and the drain on the substrate has an overlapping area with the orthographic projection of the gate on the substrate, whereby the source, the drain and the gate can completely block the irradiation of the top light onto the active layer, thereby significantly alleviating the problem of the large negative drift of the threshold voltage enhancing the illumination stability of the thin film transistor, and thus improving the display effect of the display apparatus using the thin film transistor.

The parasitic capacitance between the source/drain and the gate in the thin film transistor is tested. Compared with the thin film transistor of the prior art, the increased parasitic capacitance in the thin film transistor according to some embodiments of the present disclosure is less than about 50 fF/μm. The increased parasitic capacitance is small, that is, an overlapping area with a side length of 0.2 μm does not significantly increase the parasitic capacitance between the source/drain and the gate. Therefore, the increased parasitic capacitance does not affect the signal transmission performance of the thin film transistor. That is, the thin film transistor not only has high light stability, but also has good signal transmission performance.

In the description of the present disclosure, the orientation or positional relationship of the terms "upper", "lower" and the like is based on the orientation or positional relationship shown in the drawings, and is merely for the convenience of describing the present disclosure and does not require that the present disclosure must be constructed and operated in a specific manner, and therefore cannot be construed as limiting, the present disclosure.

In the description of the present disclosure, the description of the terms "one embodiment," "another embodiment" or the like means that the specific features, structures, materials or characteristics described in connection with the embodiments are included in at least one embodiment of the present disclosure. In the present disclosure, the schematic representation of the above terms is not necessarily directed to the same embodiment or example. Furthermore, the particular features, structures, materials, or characteristics described may be combined in a suitable manner in any one or more embodiments or examples. In addition, various embodiments or examples described in the present disclosure, as well as features of various embodiments or examples, may be combined and recombined. In addition, it should be noted that in the present disclosure, the terms "first" and "second" are used for descriptive purposes only, and are not to be construed as indicating or implying a relative importance or implicitly indicating the number of technical features indicated.

Although the embodiments of the present disclosure have been shown and described, it is understood that the above-described embodiments are illustrative and are not to be construed as limiting the scope of the disclosure. The embodiments are subject to variations, modifications, substitutions and variations.

What is claimed is:

1. A thin film transistor, comprising:
   a substrate;
   an active layer on the substrate, the active layer comprising a first conducting region, a second conducting region, and a channel region between the first conducting region and the second conducting region;
   a gate on the active layer, a gate insulating layer between the active layer and the gate, and
   a source and a drain,
   wherein the channel region includes a source side channel region, a drain side channel region, and a gate channel region, the source side channel region is between the first conducting region and the gate channel region, and the drain side channel region is between the second conducting region and the gate channel region;

the thin film transistor is a single gate transistor;
an orthographic projection of the gate on the substrate covers an orthographic projection of the gate channel region, an orthographic projection of the source side channel region and an orthographic projection of the drain side channel region are not covered by the gate on the substrate;
an orthographic projection of the gate insulating layer on the substrate covers the orthographic projection of the gate channel region, the orthographic projection of the source side channel region, and the orthographic projection of the drain side channel region, and an orthographic projection of the first conducting region and an orthographic projection of the second conducting region are not covered by the orthographic projection of the gate insulating layer on the substrate;
a length of the orthographic projection of the gate insulating layer is greater than a length of the orthographic projection of the gate, and the length of the orthographic projection of the gate insulating layer is equal to a total length of the orthographic projection of the gate channel region, the orthographic projection of the source side channel region, and the orthographic projection of the drain side channel region; and
the orthographic projection of the source fully covers the orthographic projection of the source side channel region, and the orthographic projection of the drain fully covers the orthographic projection of the drain side channel region.

2. The thin film transistor according to claim 1, wherein the orthographic projection of the source and the orthographic projection of the drain on the substrate each have an overlapping area with the orthographic projection of the gate on the substrate.

3. The thin film transistor according to claim 2, wherein the overlapping area has a side length of less than about 0.5 µm.

4. The thin film transistor according to claim 1, wherein an increased parasitic capacitance caused by that the source and the drain shielding the active layer is less than 50 fF/µm.

5. The thin film transistor according to claim 1, further comprising:
an interlayer insulating layer covering the active layer, the gate insulating layer, and the gate,
wherein the source and the drain are connected to the active layer through a first via hole and a second via hole penetrating through the interlayer insulating layer, respectively.

6. The thin film transistor according to claim 1, further comprising:
a light shielding layer between the substrate and the active layer; and
a buffer layer between the light shielding layer and the active layer,
wherein the light shielding layer is configured to prevent light from irradiating the active layer from a bottom of the thin film transistor.

7. The thin film transistor according to claim 1, wherein the thin film transistor is a top gate thin film transistor.

8. A method for fabricating a thin film transistor, comprising:
providing a substrate;
forming an active layer comprising a first conducting region, a second conducting region, and a channel region between the first conducing region and the second conducting region;
forming a gate on the active layer;
forming an interlayer insulating layer covering the active layer and the gate; and
forming a source and a drain on a side of the interlayer insulating layer opposite from the substrate,
wherein the channel region includes a source side channel region, a drain side channel region, and a gate channel region, the source side channel region is between the first conducting region and the gate channel region, and the drain side channel region is between the second conducting region and the gate channel region;
the thin film transistor is a single gate transistor;
an orthographic projection of the gate on the substrate covers an orthographic projection of the gate channel region, an orthographic projection of the source side channel region and an orthographic projection of the drain side channel region are not covered by the gate on the substrate;
a gate insulating layer is formed between the active layer and the gate, an orthographic projection of the gate insulating layer on the substrate covers the orthographic projection of the gate channel region, the orthographic projection of the source side channel region, and the orthographic projection of the drain side channel region, and an orthographic projection of the first conducting region and an orthographic projection of the second conducting region are not covered by the orthographic projection of the gate insulating layer on the substrate;
a length of the orthographic projection of the gate insulating layer is greater than a length of the orthographic projection of the gate, and the length of the orthographic projection of the gate insulating layer is equal to a total length of the orthographic projection of the gate channel region, the orthographic projection of the source side channel region, and the orthographic projection of the drain side channel region; and
the orthographic projection of the source fully covers the orthographic projection of the source side channel region, and the orthographic projection of the drain fully covers the orthographic projection of the drain side channel region.

9. The method according to claim 8, wherein forming the source and the drain comprises:
depositing a metal layer on the side of the interlayer insulating layer opposite from the substrate,
patterning the metal layer using a mask to form the source and the drain,
wherein an orthographic projection of the mask on the substrate covers at least the orthographic projection of the first conducting region and the orthographic projection of the second conducting region on the substrate.

10. The method according to claim 9, wherein the orthographic projection of the mask on the substrate further covers an orthographic projection of a part of the channel region that is not covered by the gate on the substrate.

11. The method according to claim 10, wherein the orthographic projection of the mask on the substrate further has an overlapping area with an orthographic projection of the gate on the substrate from both sides of the gate, and a side length of the overlapping area on each side is less than about 0.5 µm.

12. The method according to claim 8, further comprising:
forming a first via hole and a second via hole in the interlayer insulating layer, wherein the source is connected to the first conducting region through the first via hole, and the drain is connected to the second conducting region through the second via hole.

13. The method according to claim 8, before forming the active layer, further comprising:
   forming a light shielding layer on the substrate; and
   forming a buffer layer on a side of the light shielding layer opposite from the substrate,
   wherein the light shielding layer is configured to prevent light from irradiating the active layer from a bottom of the thin film transistor.

14. An array substrate, comprising the thin film transistor according to claim 1.

15. A display apparatus, comprising the array substrate according to claim 14.

16. The thin film transistor according to claim 1, wherein the orthographic projection of the source and the orthographic projection of the drain on the substrate each is in contact with the orthographic projection of the gate on the substrate without an overlapping area.

\* \* \* \* \*